(12) United States Patent
Konaka

(10) Patent No.: US 10,447,232 B2
(45) Date of Patent: Oct. 15, 2019

(54) FILTER DEVICE

(71) Applicant: Murata Manufacturing Co., Ltd., Nagaokakyo-shi, Kyoto-fu (JP)

(72) Inventor: Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/193,153

(22) Filed: Nov. 16, 2018

(65) Prior Publication Data

US 2019/0089329 A1 Mar. 21, 2019

Related U.S. Application Data

(63) Continuation of application No. PCT/JP2017/008840, filed on Mar. 6, 2017.

(30) Foreign Application Priority Data

May 19, 2016 (JP) ................................. 2016-100510

(51) Int. Cl.
*H03H 9/64* (2006.01)
*H03H 9/70* (2006.01)
(Continued)

(52) U.S. Cl.
CPC ........ *H03H 9/02913* (2013.01); *H01Q 1/526* (2013.01); *H01Q 5/328* (2015.01); *H03H 9/0009* (2013.01); *H03H 9/0014* (2013.01); *H03H 9/02086* (2013.01); *H03H 9/542* (2013.01); *H03H 9/568* (2013.01); *H03H 9/6483* (2013.01); *H03H 9/706* (2013.01); *H03H 9/725* (2013.01)

(58) Field of Classification Search
CPC .......... H03H 9/00; H03H 9/64; H03H 9/6456; H03H 9/70; H03H 9/706; H03H 9/972; H03H 9/725
USPC ......................................... 333/133, 187, 193
See application file for complete search history.

(56) References Cited

U.S. PATENT DOCUMENTS 6,781,479 B2 * 8/2004 Ikada ................... H03H 9/0576
333/126
6,982,612 B2 * 1/2006 Sakano ................. H01P 1/2135
333/126

(Continued)

FOREIGN PATENT DOCUMENTS

JP 2014-180060 A 9/2014
WO 2007/102560 A1 9/2007

(Continued)

OTHER PUBLICATIONS

Official Communication issued in International Patent Application No. PCT/JP2017/008840, dated May 23, 2017.

*Primary Examiner* — Dean O Takaoka
(74) *Attorney, Agent, or Firm* — Keating & Bennett, LLP

(57) ABSTRACT

A filter device includes an antenna terminal to be connected to an antenna, first inductors connected between the antenna terminal and a ground potential and defined by parallel divided inductors, and first and second acoustic wave filters commonly connected to the antenna terminal and including second inductors, respectively. The first inductors and the second inductors are electromagnetically coupled to each other mainly in a one-to-one relationship.

15 Claims, 6 Drawing Sheets

(51) Int. Cl.
*H03H 9/72* (2006.01)
*H03H 9/02* (2006.01)
*H01Q 5/328* (2015.01)
*H01Q 1/52* (2006.01)
*H03H 9/00* (2006.01)
*H03H 9/54* (2006.01)
*H03H 9/56* (2006.01)

(56) References Cited

U.S. PATENT DOCUMENTS

| | | | |
|---|---|---|---|
| 7,808,935 B2 * | 10/2010 | Koga | H01P 1/213 |
| | | | 333/132 |
| 9,923,543 B2 * | 3/2018 | Sugaya | H03H 9/64 |
| 9,935,613 B2 * | 4/2018 | Takeuchi | H03H 9/0009 |
| 9,948,276 B2 * | 4/2018 | Yamaguchi | H03H 9/64 |
| 10,063,212 B2 * | 8/2018 | Mizoguchi | H03H 9/25 |
| 2009/0147707 A1 | 6/2009 | Koga et al. | |
| 2015/0042417 A1 * | 2/2015 | Onodera | H03H 9/6433 |
| | | | 333/195 |
| 2015/0137909 A1 | 5/2015 | Okuda et al. | |
| 2016/0322956 A1 | 11/2016 | Takeuchi et al. | |
| 2017/0194939 A1 | 7/2017 | Mukai | |

FOREIGN PATENT DOCUMENTS

| | | |
|---|---|---|
| WO | 2015/104882 A1 | 7/2015 |
| WO | 2016/056377 A1 | 4/2016 |

* cited by examiner

FILTER DEVICE

CROSS REFERENCE TO RELATED APPLICATIONS

This application claims the benefit of priority to Japanese Patent Application No. 2016-100510 filed on May 19, 2016 and is a Continuation Application of PCT Application No. PCT/JP2017/008840 filed on Mar. 6, 2017. The entire contents of each application are hereby incorporated herein by reference.

BACKGROUND OF THE INVENTION

1. Field of the Invention

The present invention relates to a filter device including a plurality of pass bands.

2. Description of the Related Art

Various kinds of filter devices including a plurality of pass bands and transmitting and receiving a plurality of communication signals in different frequency bands by using a shared antenna have been proposed. One example of a filter device including a ladder filter is described in Japanese Unexamined Patent Application Publication No. 2014-180060. The ladder filter includes an inductor between a signal terminal and a series arm resonator. The filter device further includes a single inductor connected between an antenna terminal and a ground potential. The inductor connected to the antenna terminal and the inductor in the ladder filter are electromagnetically coupled to each other. This configuration increases the attenuation in a stop band.

The filter device described in Japanese Unexamined Patent Application Publication No. 2014-180060, however, is difficult to sufficiently support a structure that includes a plurality of ladder filters including inductors. That is, when the plurality of inductors included in the plurality of ladder filters and the inductor connected to the antenna terminal are electromagnetically coupled to each other, unnecessary coupling may occur between the inductors in the plurality of ladder filters with the inductor connected to the antenna terminal interposed therebetween, and the isolation characteristics may degrade. In addition, it is difficult to adjust the coefficient of coupling between the inductor connected to the antenna terminal and each of the inductors.

SUMMARY OF THE INVENTION

Preferred embodiments of the present invention provide filter devices each capable of improving isolation characteristics and easily adjusting coupling coefficients.

A filter device according to a preferred embodiment of the present invention includes an antenna terminal to be connected to an antenna, a plurality of first inductors connected between the antenna terminal and a ground potential and defined by a plurality of parallel divided inductors, and a plurality of band-pass filters commonly connected to the antenna terminal and including respective second inductors. The plurality of first inductors and the plurality of second inductors are electromagnetically coupled to each other mainly in a one-to-one relationship.

In a filter device according to a preferred embodiment of the present invention, the plurality of first inductors are electromagnetically shielded from each other. In this case, electromagnetic coupling between the parallel divided first inductors is effectively reduced or prevented. Accordingly, the isolation characteristics are further improved.

In a filter device according to a preferred embodiment of the present invention, at least one of the second inductors is connected to the ground potential. In this case, the isolation characteristics are effectively improved.

In a filter device according to a preferred embodiment of the present invention, the second inductors include at least one inductor not connected to the ground potential. In this case, the isolation characteristics are effectively improved.

In a filter device according to a preferred embodiment of the present invention, at least one of the band-pass filters is a ladder filter.

In a filter device according to a preferred embodiment of the present invention, at least one of the band-pass filters is a longitudinally coupled resonator acoustic wave filter.

In a filter device according to a preferred embodiment the present invention, the plurality of band-pass filters are included in three or more band-pass filters commonly connected to the antenna terminal. In this case, the isolation characteristics are effectively improved.

According to preferred embodiments of the present invention, the filter devices each capable of improving the isolation characteristics and easily adjusting the coefficients of coupling are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings.

The preferred embodiments of the present invention described in this specification are illustrative, and it is noted that configurations may be replaced in part or combined between different preferred embodiments.

Figure 1:
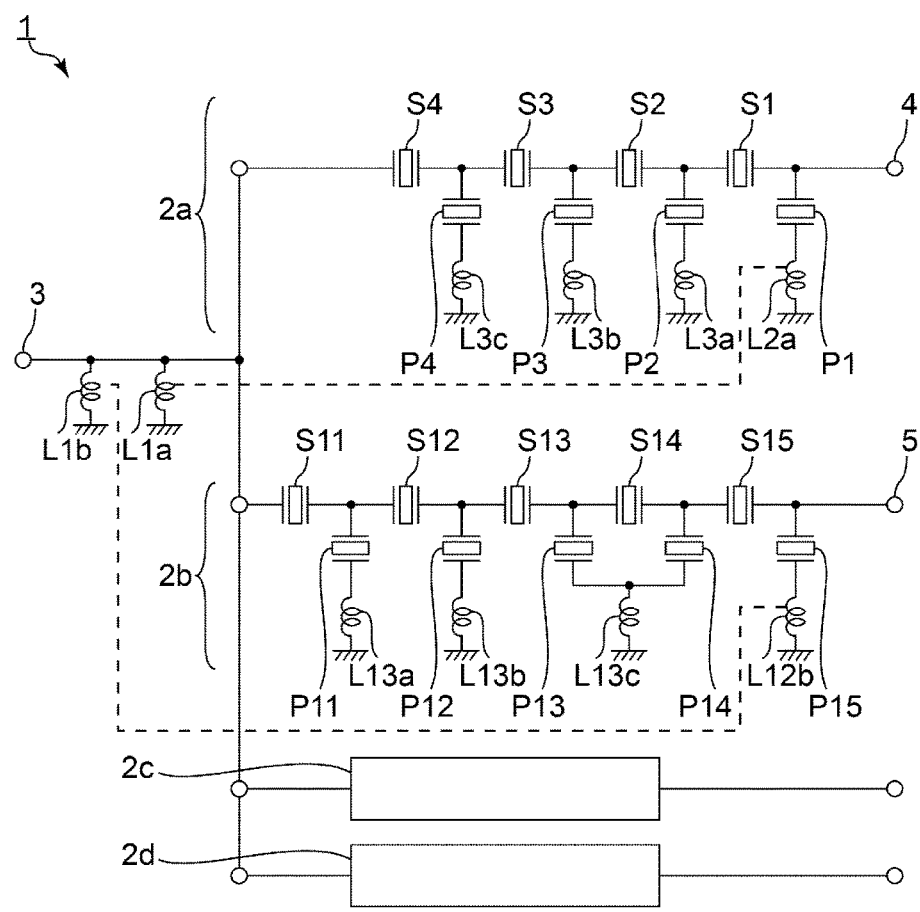
FIG. 1 is a schematic circuit diagram of a filter device according to a first preferred embodiment of the present invention.

FIG. 1 is a schematic circuit diagram of a filter device according to a first preferred embodiment of the present invention.

A filter device 1 includes an antenna terminal 3 to be connected to an antenna. The filter device 1 includes first to fourth acoustic wave filters 2a to 2d commonly connected to the antenna terminal 3. Parallel divided first inductors L1a and L1b are connected between the antenna terminal 3 and a ground potential. The first inductors L1a and L1b provide impedance matching.

In the present preferred embodiment, the first acoustic wave filter 2a is preferably, for example, a transmission filter having a pass band in the range from about 1710 MHz to about 1785 MHz, which is the transmission band of Band 3. The second acoustic wave filter 2b is preferably, for example, a reception filter having a pass band in the range from about 2110 MHz to about 2170 MHz, which is the reception band of Band 1. The third acoustic wave filter 2c is preferably, for example, a transmission filter having a pass band in the range from about 1920 MHz to about 1980 MHz, which is the transmission band of Band 1. The fourth acoustic wave filter 2d is preferably, for example, a reception filter having a pass band in the range from about 1805 MHz to about 1880 MHz, which is the reception band of Band 3. The pass bands of the first to fourth acoustic wave filters 2a to 2d are not limited to the above-described ranges.

The first and second acoustic wave filters 2a and 2b are preferably ladder filters, for example. The third and fourth acoustic wave filters 2c and 2d indicated with blocks in FIG. 1 are not limited to any particular configurations.

The first acoustic wave filter 2a includes an input terminal 4. The first acoustic wave filter 2a includes series arm resonators S1 to S4 connected in series to each other between the input terminal 4 and the antenna terminal 3 and parallel arm resonators P1 to P4 connected to the ground potential. The first acoustic wave filter 2a includes a second inductor L2a connected between the parallel arm resonator P1 and ground potential. As indicated by the broken line in FIG. 1, the second inductor L2a is electromagnetically coupled to the first inductor L1a.

The second acoustic wave filter 2b includes an output terminal 5. The second acoustic wave filter 2b includes series arm resonators S11 to S15 connected in series to each other between the output terminal 5 and antenna terminal 3 and parallel arm resonators P11 to P15 connected to the ground potential. The second acoustic wave filter 2b includes a second inductor L12b connected between the parallel arm resonator P15 and ground potential. As indicated by the broken line in FIG. 1, the second inductor L12b is electromagnetically coupled to the first inductor L1b. As in the present preferred embodiment, the first inductors L1a and L1b may preferably be electromagnetically shielded from each other. The inductance of the first inductor L1a is not limited to a particular value, and it may preferably be about 3.24 nH, for example. The inductance of the first inductor L1b is not limited to a particular value, and it may preferably be about 3.24 nH, for example. The details of the circuit configurations of the first and second acoustic wave filters 2a and 2b are described below.

The characteristics and features of the present preferred embodiment are configurations described below. The first inductors L1a and L1b are parallel divided inductors. The first inductor L1a is electromagnetically coupled mainly to the second inductor L2a, and the first inductor L1b is electromagnetically mainly coupled to the second inductor L12b. Thus, the isolation characteristics are improved, and the coefficients of coupling are easily adjusted. This will be described together with the detailed configurations of the first and second acoustic wave filters 2a and 2b.

In the first acoustic wave filter 2a, the parallel arm resonator P1 is connected between the junction of the input terminal 4 and series arm resonator S1 and the ground potential. The parallel arm resonator P2 is connected between the junction of the series arm resonators S1 and S2 and the ground potential. The parallel arm resonator P3 is connected between the junction of the series arm resonators S2 and S3 and the ground potential. The parallel arm resonator P4 is connected between the junction of the series arm resonators S3 and S4 and the ground potential.

The second inductor L2a described above is connected between the parallel arm resonator P1 and ground potential. A third inductor L3a is connected between the parallel arm resonator P2 and the ground potential. A third inductor L3b is connected between the parallel arm resonator P3 and the ground potential. A third inductor L3c is connected between the parallel arm resonator P4 and the ground potential.

In the second acoustic wave filter 2b, the parallel arm resonator P11 is connected between the junction of the series arm resonators S11 and S12 and the ground potential. The parallel arm resonator P12 is connected between the junction of the series arm resonators S12 and S13 and the ground potential. The parallel arm resonator P13 is connected between the junction of the series arm resonators S13 and S14 and the ground potential. The parallel arm resonator P14 is connected between the junction of the series arm resonators S14 and S15 and the ground potential. The parallel arm resonator P15 is connected between the junction of the series arm resonator S15 and output terminal 5 and the ground potential.

A third inductor L13a is connected between the parallel arm resonator P11 and the ground potential. A third inductor L13b is connected between the parallel arm resonator P12 and the ground potential. End portions of the parallel arm resonators P13 and P14 that are near the ground potential are commonly connected to a third inductor L13c. The third inductor L13c is connected to the ground potential. The second inductor L12b is connected between the parallel arm resonator P15 and the ground potential.

In the present preferred embodiment, as described above, the first inductor L1a is electromagnetically coupled mainly to the second inductor L2a. Thus, propagation of unnecessary signals to the antenna terminal 3 is reduced or prevented. On the other hand, the first inductor L1b is electromagnetically coupled mainly to the second inductor L12b. Thus, outputting of unnecessary signals from the output terminal 5 is reduced or prevented. Accordingly, the isolation characteristics are effectively improved.

The word "mainly" in the expression of "the first inductor L1a is electromagnetically coupled mainly to the second inductor L2a" includes a configuration in which the first inductor L1a is electromagnetically coupled to the second inductor L2a and is also more weakly electromagnetically coupled to another second inductor than the electromagnetic coupling with the second inductor L2a. That is, in preferred embodiments of the present invention, a plurality of first inductors and a plurality of second inductors are electromagnetically coupled to each other mainly in a one-to-one relationship. This configuration, in which they are electromagnetically coupled mainly in a one-to-one relationship, includes a configuration in which a first inductor is electromagnetically coupled to a second inductor mainly in a one-to-one relationship and is also more weakly electromagnetically coupled to another second inductor than the electromagnetic coupling with the second inductor in a one-to-one relationship. In other words, the configuration in which they are electromagnetically coupled mainly in a one-to-one relationship means that each of the plurality of first inductors has a single combination with a corresponding one of the plurality of second inductors that is most strongly electromagnetically coupled thereto and that each of the plurality of first inductors may be electromagnetically coupled to a second inductor other than the second inductor most strongly electromagnetically coupled thereto.

Further, the first inductors L1a and L1b are parallel divided inductors. Thus, in a state in which the total inductance of the first inductors L1a and L1b is an optimal value, the inductances of the first inductors L1a and L1b are able to be individually adjusted. Accordingly, in the optimal state, the coefficient of coupling between the first inductor L1a and the second inductor L2a is able to be adjusted, and the coefficient of coupling between the first inductor L1b and second inductor L12b is also able to be adjusted.

In the present preferred embodiment, the coefficient of coupling between the first inductor L1a and second inductor L2a is preferably about −0.0017, for example. The coefficient of coupling between the first inductor L1b and second inductor L12b is preferably about −0.0037, for example. In this manner, in the filter device 1, the coefficients of coupling are able to be easily and suitably adjusted.

The first acoustic wave filter 2a may have any circuit configuration that includes the second inductor L2a electromagnetically coupled to the first inductor L1a. Similarly, the second acoustic wave filter 2b may have any circuit configuration that includes the second inductor L12b electromagnetically coupled to the first inductor L1b.

The advantages of the present preferred embodiment will be described in detail by comparison with a comparative example.

Figure 2:
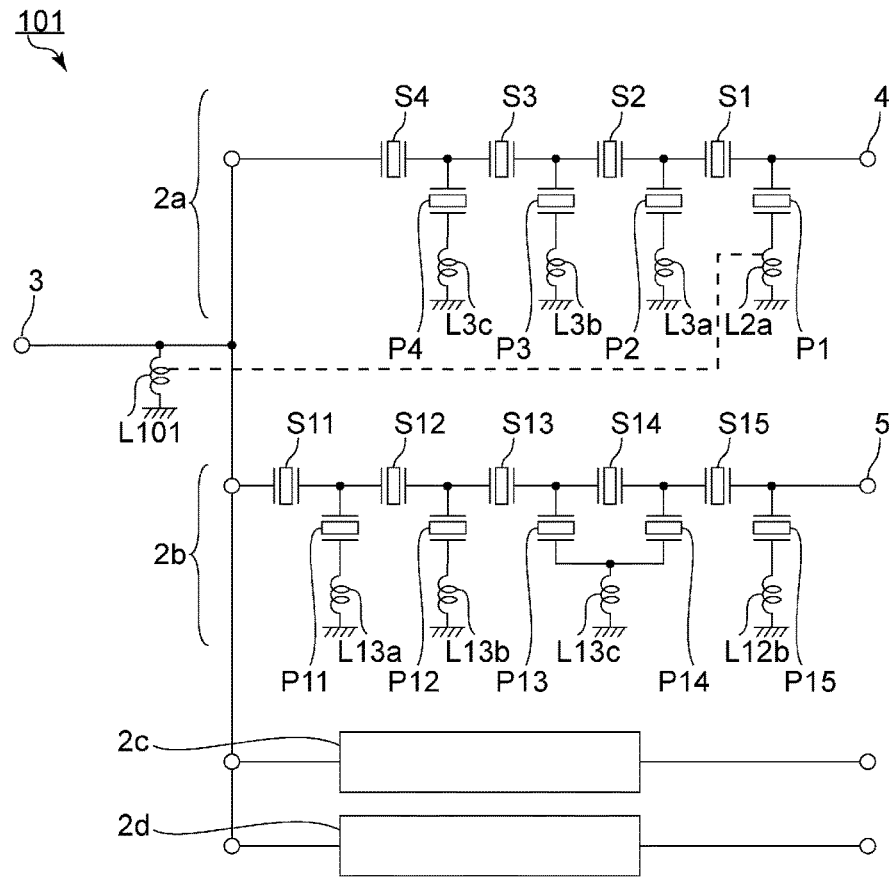
FIG. 2 is a schematic circuit diagram of a filter device in a comparative example.

FIG. 2 is a schematic circuit diagram of a filter device in a comparative example.

A filter device 101 according to the comparative example is different from the first preferred embodiment in that it includes only one inductor L101 connected to the antenna terminal 3 and ground potential. The inductor L101 is electromagnetically coupled to the second inductor L2a in the first acoustic wave filter 2a.

Figure 3:
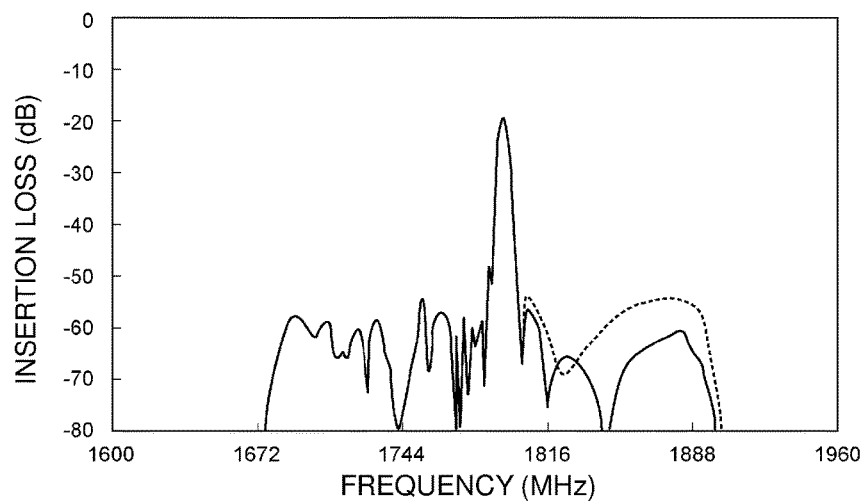
FIG. 3 illustrates isolation characteristics of first and fourth acoustic wave filters in the first preferred embodiment of the present invention and in the comparative example.
Figure 4:
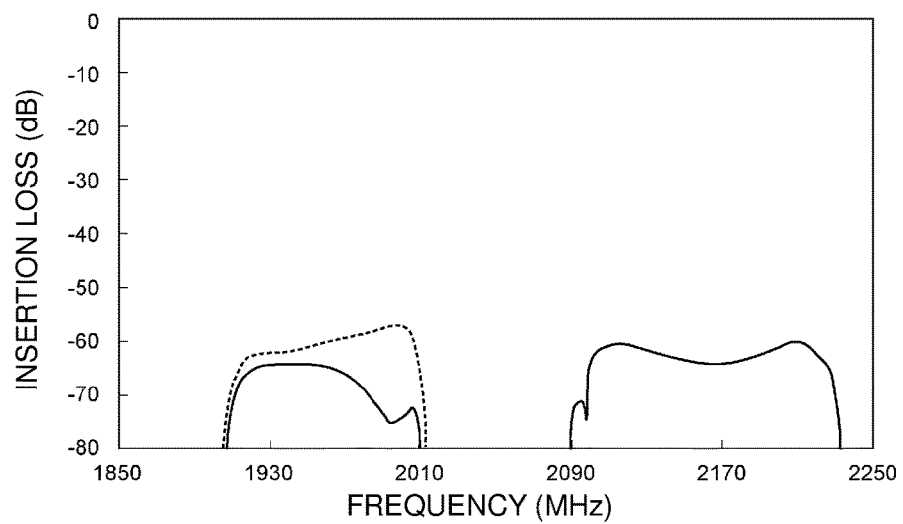
FIG. 4 illustrates isolation characteristics of second and third acoustic wave filters in the first preferred embodiment of the present invention and in the comparative example.
Figure 5:
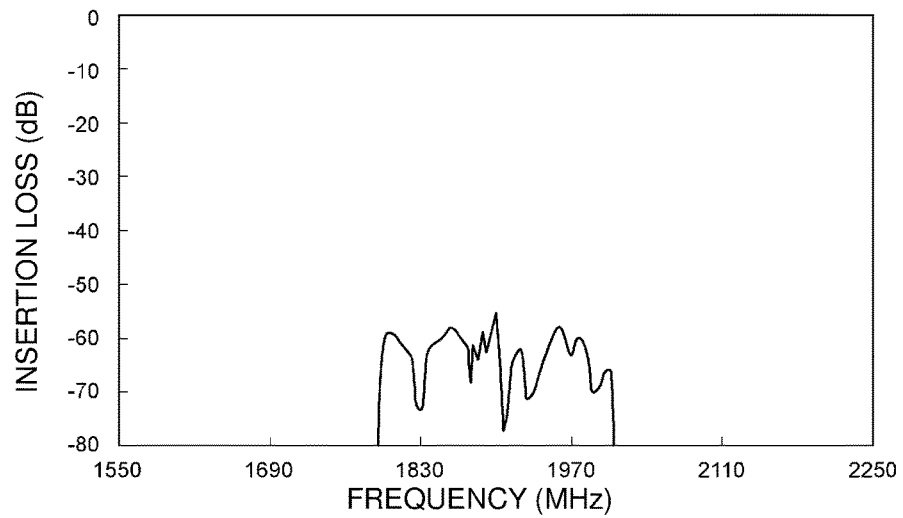
FIG. 5 illustrates cross-isolation characteristics of the third and fourth acoustic wave filters in the first preferred embodiment of the present invention and in the comparative example.
Figure 6:
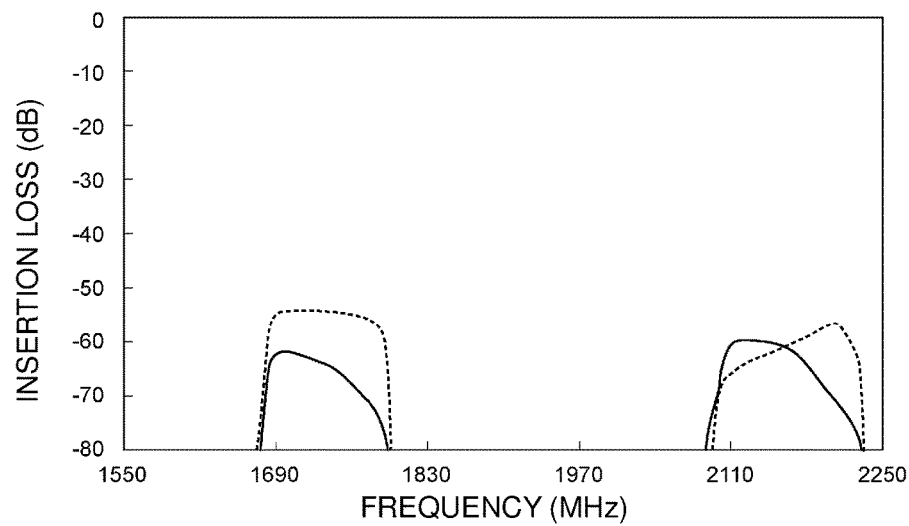
FIG. 6 illustrates cross-isolation characteristics of the first and second acoustic wave filters in the first preferred embodiment of the present invention and in the comparative example.

FIG. 3 illustrates isolation characteristics of the first and fourth acoustic wave filters in the first preferred embodiment and in the comparative example. FIG. 4 illustrates isolation characteristics of the second and third acoustic wave filters in the first preferred embodiment and in the comparative example. FIG. 5 illustrates cross-isolation characteristics of the third and fourth acoustic wave filters in the first preferred embodiment and in the comparative example. FIG. 6 illustrates cross-isolation characteristics of the first and second acoustic wave filters in the first preferred embodiment and in the comparative example. The solid lines represent results for the first preferred embodiment, and the broken lines represent results for the comparative example. The cross-isolation characteristics indicate isolation characteristics between different Bands.

FIG. 3 shows that the isolation characteristics of the first and fourth acoustic wave filters in the first preferred embodiment are improved in comparison with those in the comparative example. FIG. 4 shows that the isolation characteristics of the second and third acoustic wave filters in the first preferred embodiment are also improved in comparison with those in the comparative example. FIG. 5 shows that the cross-isolation characteristics of the third and fourth acoustic wave filters are equal or substantially equal in the first preferred embodiment and comparative example. FIG. 6 shows that the cross-isolation characteristics of the first and second acoustic wave filters in the first preferred embodiment are improved in comparison with those in the comparative example.

In the comparative example, as illustrated in FIG. 2, because only the second inductor L2a in the first acoustic wave filter 2a and the inductor L101 are electromagnetically coupled to each other, the isolation characteristics are not sufficiently improved.

In contrast, in the present preferred embodiment, as illustrated in FIG. 1, the second inductor L2a in the first acoustic wave filter 2a and the second inductor L12b in the second acoustic wave filter 2b are electromagnetically coupled to the first inductors L1a and L1b, respectively, in a one-to-one relationship. Thus, the out-of-band attenuations for the first and second acoustic wave filters 2a and 2b are able to be increased, and the isolation characteristics are effectively improved.

For the first and second acoustic wave filters 2a and 2b, in particular, the out-of-band attenuation on a higher frequency side of each of the pass bands is further increased by the electromagnetic coupling.

As illustrated in FIGS. 5 and 6, the cross-isolation characteristics of the first and second acoustic wave filters 2a and 2b and those of acoustic wave filters other than the first and second acoustic wave filters 2a and 2b are improved. Accordingly, preferred embodiments of the present invention are applicable to, in particular, cases in which three or more acoustic wave filters are included.

As in the present preferred embodiment, the first and second acoustic wave filters 2a and 2b, whose pass bands are different Bands, may preferably include the electromagnetically coupled second inductors L2a and L12b, respectively, as described above. Thus, the cross-isolation characteristics are effectively improved.

In the transmission filter, the second inductor L2a may preferably be an inductor connected between the input terminal 4 and ground potential. This configuration provides an effective improvement in impedance matching. In the reception filter, the second inductor L12b may preferably be an inductor connected between the output terminal 5 and ground potential. This configuration provides an effective improvement in impedance matching.

The arrangement of the second inductors L2a and L12b, which are electromagnetically coupled to the first inductors L1a and L1b, respectively, is not limited to the above-described arrangement.

The first inductors L1a and L1b may preferably be electromagnetically shielded from each other. This configuration provides an effective reduction or prevention of electromagnetic coupling between the first inductors L1a and L1b. Accordingly, the isolation characteristics are further improved.

Figure 7:
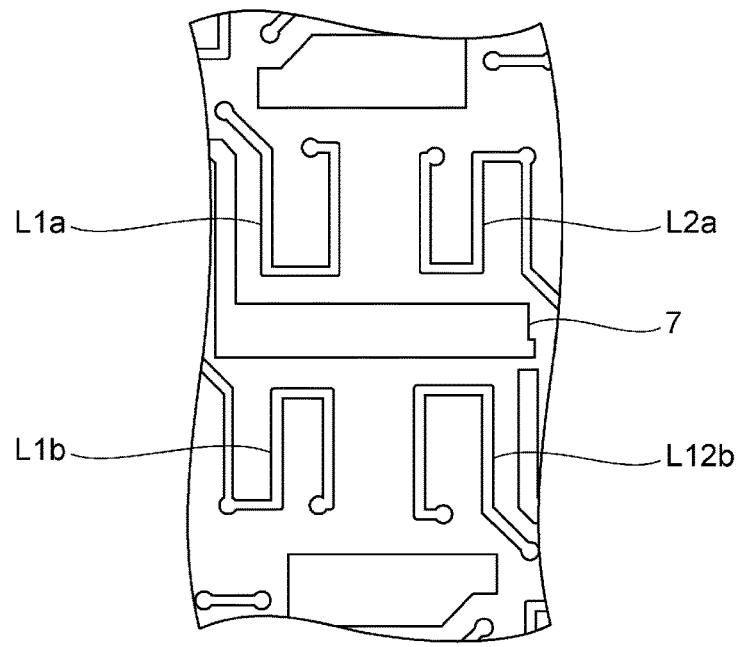
FIG. 7 is an enlarged plan view that illustrates an example configuration in the first preferred embodiment of the present invention.
Figure 8:
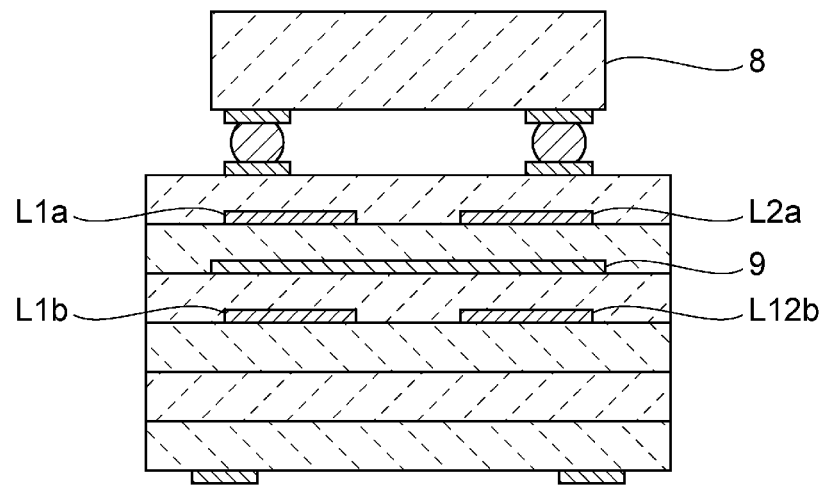
FIG. 8 is a front section view that illustrates an example configuration in the first preferred embodiment of the present invention.

The configuration in which the first inductors L1a and L1b are electromagnetically shielded from each other is not limited to a particular configuration. One example is illustrated in FIG. 7. In the case in which the first inductors L1a and L1b are disposed on the same substrate, they may be electromagnetically shielded by arranging wiring 7 between them. Another example is illustrated in FIG. 8. In the case in which the filter device includes an element 8 and a multilayer body on which the element is mounted, the first inductors L1a and L1b may be electromagnetically shielded by providing them on different layers. In this case, a metal layer 9 may preferably be disposed between the first inductors L1a and L1b. This arrangement achieves more stable electromagnetic shielding between the first inductors L1a and L1b.

Three or more acoustic wave filters may include second inductors. The second inductors may be electromagnetically coupled to three or more parallel divided first inductors in a one-to-one relationship. In this case, the isolation characteristics are effectively enhanced.

In the present preferred embodiment, because only two first inductors L1a and L1b are included, the above-described advantages are obtainable, while the filter device is able to be reduced in size.

Figure 9:
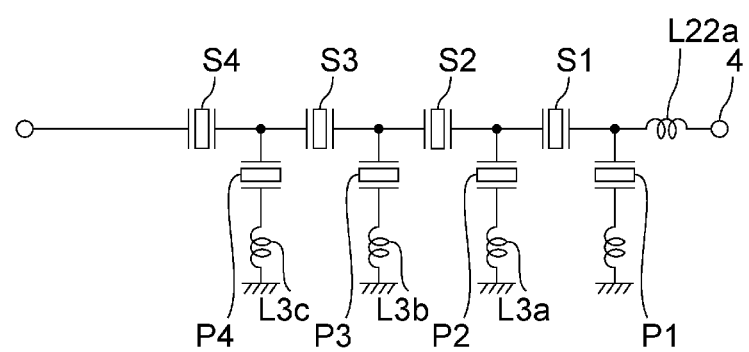
FIG. 9 is a circuit diagram of a first acoustic wave filter in a first variation of the first preferred embodiment of the present invention.

As in a first variation of the present preferred embodiment illustrated in FIG. 9, the first acoustic wave filter may include a second inductor L22a connected between the series arm resonator S1 and input terminal 4. As in this case, the plurality of second inductors in the filter device may include the second inductor L22a, which is not directly connected to the ground potential.

Figure 10:
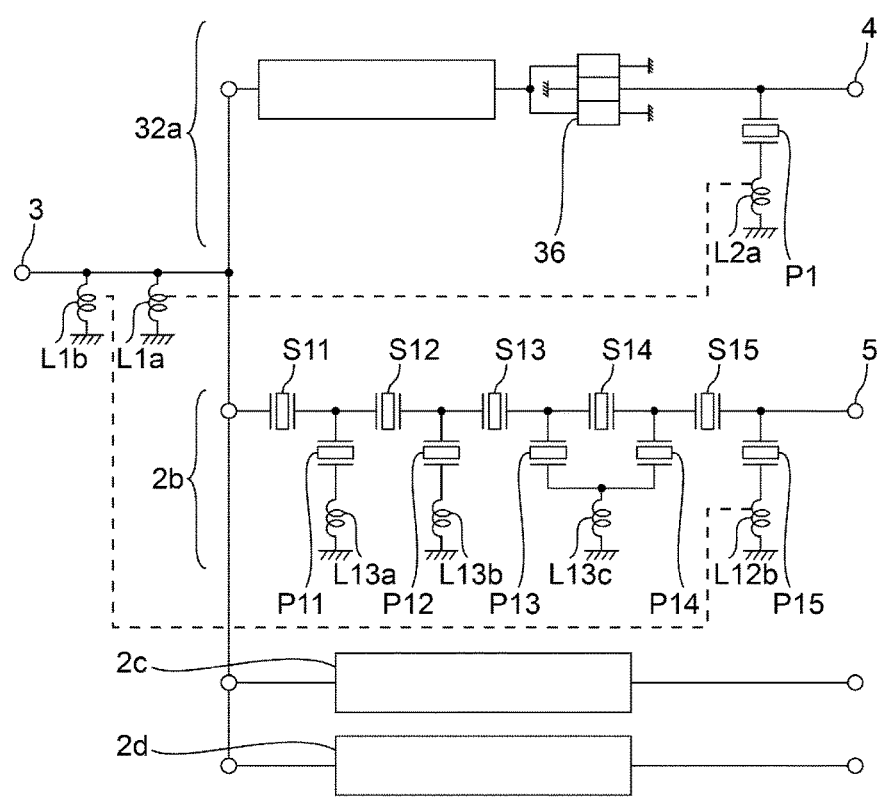
FIG. 10 is a schematic circuit diagram of a filter device according to a second variation of the first preferred embodiment of the present invention.

As in a second variation of the present preferred embodiment illustrated in FIG. 10, a first acoustic wave filter 32a may include a longitudinally coupled resonator acoustic wave filter 36. In this case, the first inductor L1a and second inductor L2a are electromagnetically coupled to each other. In FIG. 10, a portion of the first acoustic wave filter 32a is indicated with a block.

The filter device may include a plurality of filters other than acoustic wave filters. In this case, a plurality of parallel divided first inductors and a plurality of second inductors are electromagnetically coupled to each other mainly in a one-to-one relationship.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   an antenna terminal to be connected to an antenna;
   a plurality of first inductors connected between the antenna terminal and a ground potential and defined by a plurality of parallel divided inductors; and
   a plurality of band-pass filters commonly connected to the antenna terminal and including respective second inductors; wherein
   the plurality of first inductors and the second inductors are electromagnetically coupled to each other mainly in a one-to-one relationship.

2. The filter device according to claim 1, wherein the plurality of first inductors are electromagnetically shielded from each other.

3. The filter device according to claim 1, wherein at least one of the second inductors is connected to the ground potential.

4. The filter device according to claim 1, wherein the second inductors include at least one inductor not connected to the ground potential.

5. The filter device according to claim 1, wherein at least one of the plurality of band-pass filters is a ladder filter.

6. The filter device according to claim 1, wherein at least one of the plurality of band-pass filters is a longitudinally coupled resonator acoustic wave filter.

7. The filter device according to claim 1, wherein the plurality of band-pass filters include three or more band-pass filters commonly connected to the antenna terminal.

8. The filter device according to claim 1, wherein the plurality of band-pass filters include first, second, third, and fourth acoustic wave filters commonly connected to the antenna terminal.

9. The filter device according to claim 8, wherein the first and third acoustic wave filters are transmission filters, and the second and fourth acoustic wave filters are reception filters.

10. The filter device according to claim 8, wherein
    the first acoustic wave filter is a transmission filter having a pass band in a range from about 1710 MHz to about 1785 MHz;
    the second acoustic wave filter is a reception filter having a pass band in a range from about 2110 MHz to about 2170 MHz;
    the third acoustic wave filter is a transmission filter having a pass band in a range from about 1920 MHz to about 1980 MHz; and
    the fourth acoustic wave filter is a reception filter having a pass band in a range from about 1805 MHz to about 1880 MHz.

11. The filter device according to claim 8, wherein the first and second acoustic wave filters are ladder filters.

12. The filter device according to claim 8, wherein
    at least one of the first and second acoustic wave filters includes:
       an input terminal;
       series arm resonators connected in series to each other between the input terminal and the antenna terminal; and
       parallel arm resonators connected to the ground potential; wherein
    one of the second inductors is connected between one of the parallel arm resonators and the ground potential.

13. The filter device according to claim 12, wherein at least one third inductor is connected between another one of the parallel arm resonators and the ground potential.

14. The filter device according to claim 1, wherein a coefficient of coupling between one of the plurality of first inductors and a corresponding one of the second inductors is about −0.0017.

15. The filter device according to claim 14, wherein a coefficient of coupling between another one of the plurality of first inductors and a corresponding another one of the second inductors is about −0.0037.

* * * * *